United States Patent [19]

Williams et al.

[11] Patent Number: 4,871,982

[45] Date of Patent: Oct. 3, 1989

[54] LOW-VOLTAGE OSCILLATOR WITH SEPARATE STARTUP MODE

[75] Inventors: Clark R. Williams, Plano; Ching-Lin Jiang, Dallas, both of Tex.

[73] Assignee: Dallas Semiconductor Corporation, Dallas, Tex.

[21] Appl. No.: 264,193

[22] Filed: Oct. 28, 1988

[51] Int. Cl.$^4$ .............................................. H03B 5/36
[52] U.S. Cl. ................................ 331/75; 331/116 FE
[58] Field of Search .......... 331/74, 75, 108 C, 108 D, 331/116 R, 116 FE, 117 FE, 158

[56] References Cited

U.S. PATENT DOCUMENTS 4,085,359  4/1978  Ahmed ............................... 323/22 T
4,710,730  12/1987  Doyle, III .................... 331/116 FE Primary Examiner—Siegfried H. Grimm
Attorney, Agent, or Firm—Worhsam, Forsythe, Sampels & Wooldridge

[57] ABSTRACT

A low-power crystal-controlled CMOS oscillator wherein a long and wide additional transistor is provided in the first stage of the output amplifier. This prevents the output amplifier from diverting too much current from the primary amplifier stage during startup.

39 Claims, 4 Drawing Sheets

LOW-VOLTAGE OSCILLATOR WITH SEPARATE STARTUP MODE

CROSS REFERENCE TO OTHER APPLICATIONS

The following applications of common assignee contain some disclosure and drawings in common with the present application:

Ser. No. 264,486, filed 10/28/88, entitled Oscillator With Trimming On Both Input and Output Sides
Ser. No. 264,125, filed 10/28/88, entitled Integrated Circuit With Remappable Interrupt Pins and
Ser. No. 264,233, filed 10/28/88, entitled Low-Power Clock/Calendar Architecture.

Each of these applications has an effective filing date identical with that of the present application, and is hereby incorporated by reference.

BACKGROUND AND SUMMARY OF THE INVENTION.

The present invention relates to oscillator circuits, and particularly low-power frequency-stable oscillator circuits configured using CMOS integrated circuit technology, and to systems which use such oscillators for timing functions.

In many system applications, it is desired to provide an oscillator which will run with extreme frequency precision on extremely low power. Some examples of such applications include uninterruptible clock/calendar subsystems, electronic watches and other consumer products, portable measuring equipment, portable communications equipment, and systems for space environments. However, these two demands are to some extent incompatible, in that circuit solutions which tend to improve one of these two parameters tend to degrade the other. The present invention is particularly aimed at systems where both of these requirements must be satisfied.

In most systems where precise frequency control is needed at reasonable cost, a quartz-crystal-controlled oscillator will be used. Quartz crystals can be bought with a sharply tuned resonance frequency. Such a crystal can be used to provide a very sharp resonance in the feedback path of the oscillator, and thereby stabilize the frequency of the oscillator.

One known circuit configuration which can be used for low-power frequency-stabilized oscillators is a Pierce oscillator, in which the crystal is connected across a single-stage CMOS amplifier. To minimize power consumption, a large source resistor is used to provide a virtual ground level for the oscillator which is far above the system ground voltage. In such a circuit, the source resistor will pull up the virtual ground level until it is within approximately one PMOS threshold voltage ($V_{TP}$) plus one NMOS threshold voltage ($V_{TN}$) below the on-chip positive supply voltage ($V_{DD}$). Thus, such a circuit configuration, as long as it operates on extremely low current, will be relatively insensitive to fluctuations in the supply voltage ($V_{DD}$), since such fluctuations will tend to change the voltage drop across the source resistor rather than the drop across the circuit. (However, such a circuit will obviously be sensitive to variations in current draw, which would cause the voltage across the source resistor to vary). Thus, in such a configuration, the voltage of the circuit nodes will tend to be set by the device threshold voltages, while the current draw is controlled by the source resistor.

In such circuit configurations, it is preferable to take the feed for the first output buffer stage from the input side of the amplifier. This avoids degrading the loop gain of the amplifier plus resonator. In environments where such a circuit may have to cope with fluctuating supply voltage as described, the bias point for the input from the amplifier to the following stages must be set correctly. For example, it is possible for some circuits of this type to operate in a mode wherein oscillation is occurring at the amplifier, but no signal appears at the output of the output buffer, since an incorrect bias level has swamped the AC signal at the input to the output buffer. In such circuits, an appropriate bias level for inter-stage inputs can be provided by using a transmission gate (with long-channel NMOS and PMOS transistors in parallel) to partly couple the output side of the amplifier across to the input side of the amplifier. If the N-channel and P-channel threshold voltages have approximately equal magnitude, the inverter stage will have almost no net body effect; but the transmission gate will have significant body effect, so that the effective threshold voltages of the devices in the transmission gate are increased slightly in magnitude. Therefore, even though the gates of the devices in the transmission gate are tied to $V_{DD}$ and $V_{SSH1}$, the transmission gate will be barely off if the bias at node B (as shown in FIG. 1) is optimal. However, if the bias point needs to be shifted, the transmission gate 130 will pass charge accordingly.

Since the preferred circuit configuration for such applications uses only a very minimal number of stages, without extensive buffering to isolate nodes from each other, this configuration is less stable than some others. That is, parameter variation at one node may affect the behavior of other nodes. In such a circuit configuration, since the drop across the active elements is essentially defined by the device threshold voltages, process-induced variations in the threshold voltages can significantly affect the voltage drops seen. For example, where both N-channel and P-channel threshold voltages $V_{TN}$ and $V_{TP}$ are specified at $0.75 \pm 0.25$ volts, the effective power supply voltage different across the oscillator may be anywhere from one to two volts, i.e. a 2:1 variation is possible. In fact, this variation in threshold voltages may cause as much as a 3:1 variation in current, and change the loop gain of the oscillator.

A problem which has been discovered with such circuits is current diversion when the oscillator is started up. To better understand this problem, the concept of the "trip point" of a circuit stage will first be explained.

The solid-line curve of FIG. 6 is a typical curve of output voltage ($V_{out}$) versus input voltage ($V_{in}$) behavior of an inverter stage for a typical MOS inverter circuit. As this graph shows, the output voltage of an inverter will shift rapidly when the input voltage reaches voltages close to the trip voltage $V_{trip}$, from a voltage near a first power supply $V_{DD}$ to a voltage near a second power supply $V_{SS}$. This curve is typical of a digital circuit (such as an inverter), but the same concept can also be applied to some (but not all) analog circuits. In some nonlinear analog circuits (such as the amplifier stage 110 in FIG. 1), a plot of $V_{out}$ versus $V_{in}$ will show maximum steepness near an intermediate input voltage, which may be referred to here as the trip voltage $V_{trip}$.

The dotted line in FIG. 6 shows how these characteristics can be modified. For example, the trip voltage of an inverter can be shifted by changing the ratio of the channel lengths of the PMOS and NMOS devices. For example, the dotted line curve of FIG. 6 shows an alternative inverter circuit with a somewhat lower trip voltage. Such a lower trip voltage could be produced by shortening the length of the n-channel pull-down transistor. For example, if the first buffer stage 140 has a curve corresponding to the solid line in FIG. 6, then the modified first buffer stage 240 shown in FIG. 2, wherein the n-channel device has a shorter channel length, might produce an inverter curve as shown in the dashed line of FIG. 6.

When the oscillator starts up, the gain stage of the oscillator is expected to be biased at its trip voltage. However, if the buffer stages have the same trip voltage, and are biased at their trip voltages, current will be diverted through those stages (since the following stages will normally have transistors with shorter channel lengths). This may mean that, at turn on time, the available current (which is limited by the source resistor) flows almost entirely through the buffer stages, and not through the oscillator. For example, in a configuration where the source resistor limits the total current to about 120 nanoamps, it has been found that, in such a condition, the current through the active devices of the oscillator may be as little as one or two nanoamps.

If the current through the oscillator is very small, the oscillator may not be able to begin oscillation. That is, a second order effect in low-power CMOS integrated circuits is that the gain of a circuit stage will be reduced if the current available to that stage is sufficiently limited. In the example just given, if the oscillator can only draw one or two nanoamps, the instantaneous loop gain may not be high enough to begin oscillation. Therefore, in such a condition the oscillator may simply stay in a "stuck" condition.

In fact, it has been experimentally discovered that, if the design trip voltage of the gain stage in the amplifier and of the following inverter stages are equal, then the onset of oscillation can be determined solely by externally generated electrical noise. (The electrical noise may be sufficient to bring the oscillator to an operating point where its loop gain exceeds unity, so that oscillation can thereafter be maintained.) This produces an undesirable degree of unreliability. This is particularly true since the testers normally used to test integrated circuits tend to be high-noise environments. Thus, integrated circuits which will reliably begin oscillation in a tester (due to the high electrical noise levels) may be unable to begin oscillation in an actual service environment. This is very undesirable.

This problem of hang-up can be avoided by designing the inverter and the following buffer stage to have unequal trip voltages. FIG. 2 is an embodiment of this kind. Since n-channel device 244 has a shorter channel length than the p-channel pull up 242, transistor 244 will turn on when the oscillator's gain stage 210 is still at its trip point. (That is, with device dimensions as shown, the trip voltage of the first buffer stage 240 is lower than that of gain stage 210.) This assures that node D will be low, and therefore also assures that buffer stages 240, 150, and 160 will not consume large amounts of current.

However, schemes of this type have a further limitation. In a low-power circuit, it is desirable to keep the operating current as low as possible. Thus, the value of the source resistor is chosen to be high enough that the amplitude of the signal at the input to the first buffer stage is quite small. However, if the first buffer stage has a trip voltage which is not exactly equal to the trip voltage of the gain stage in the oscillator, there will be some risk that the bias signal (which is defined by the operating characteristics of the oscillator) may be inappropriate for the first buffer stage. In fact, if the trip voltage of the first buffer is too different from the trip voltage of the gain stage in the oscillator, it is possible that the AC signal at the input of the first buffer stage may be entirely swamped. That is, the larger the difference in trip voltages between the gain stage of the amplifier and the first buffer stage, the larger magnitude of signal must be supplied at the input to the buffer stage. This in turn implies that the gain stage to the oscillator will require more current draw, and therefore will consume more power, which is undesirable.

Thus, according to this (novel) analysis of the characteristics of such a circuit, it is desirable that the trip voltages of the oscillator gain stage and of the first buffer stage be exactly equal when the oscillator is running, but be different when the oscillator is starting up.

The present invention introduces additional circuit elements which cause the effective trip voltage of the first buffer stage to be dynamically modified. In the presently preferred embodiment, this is done by adding an additional PMOS transistor, with an increased channel length, to the first output buffer stage.

It should also be noted that, less preferably, other device structures could be used to shift the trip voltage of the first buffer stage dynamically. For example, a dual-gate FET structure could be used to accomplish this. Alternatively, a FET structure could be used wherein the channel was both front-gated and back-gated. Alternatively, a stacked gate structure could be used (physically somewhat analogous to conventional EPROM device structures) where charge stored in one electrode causes the effective gate voltage seen by a second electrode to change.

The effect of the longer channel length is to slightly shift the threshold voltage of the device (and therefore the trip voltage of the circuit stage). For example, in an alternative embodiment wherein the PMOS pass transistor 146 (as shown in FIG. 1) is 30 microns wide and 16 microns long, and the transistors 112 and 114 of the oscillator gain stage are both 12 microns long, a simulation of a sample set of process conditions indicated a threshold voltage $V_{TP}$ of 1.2231 for the PMOS pass transistor 146, and a threshold voltage $V_{TP}$ equals 1.2164 for the pull-up transistor 112 in the oscillator gain stage 110. This seven milliVolt difference in threshold voltages corresponds to current draws, at the bias point, of 72 nanoamps through the oscillator 110 and 20 nanoamps through the first buffer stage 140. Thus, the 7 milliVolt threshold shift in the p-channel pass transistor 146 has the effect of diverting the majority of current into the oscillator gain stage, as desired.

The use of even longer transistor channel lengths can produce additional shift in threshold voltage (and hence in the trip voltage of the resulting circuit). However, it should be noted that successively less change in threshold voltage is produced by a given increase in channel length, at longer channel lengths.

In the presently preferred embodiment, the CMOS amplifier stage has quite long transistors. In the presently preferred embodiment, using two micron technology, the transistors of this amplifier stage have 12 micron channel lengths. These long channel lengths effectively increase the threshold voltage of these transistors by about 15 milliVolts.

As noted, in the presently preferred embodiment, a pass transistor is added in the first stage of the output buffer. Where the source resistor is placed on the negative (ground) side of the circuit, this added pass transistor is placed on the upper leg of the first stage output buffer, and is preferably PMOS. A simple digital signal is used to switch the gate voltage of this PMOS pass transistor between two possible signals. In one mode (e.g. at startup), the gate of this long and wide PMOS pass transistor is connected, in common with the gates with the PMOS and NMOS load and driver transistors in this stage, to the signal across the crystal. Since this pass transistor is substantially longer than the transistors in the amplifier stage, the series combination of the PMOS load and pass transistors (in the first stage of the output buffer) will pass much less current than the PMOS pull-up transistor in the amplifier, when these transistors are all biased near cut off. (That is, when transistors 112 and 142 are just turning on, transistor 146 will still be fairly well turned off.) Thus, in this mode the majority of the operating current will go through the amplifier stage. This assures a reliable turn-on of the oscillation. In a second operating mode, the PMOS pass transistor is turned hard on. Since this device is quite wide, in this mode it simply connects the PMOS pull-up transistor directly to the positive power supply. Thus, the lengths of the PMOS load and NMOS driver in the first stage of the output buffer can be selected for optimal operation in this mode. Thus, this circuit configuration provides extremely stability in the oscillator, and also provides a reliable good match between the oscillator and the output buffer, without degrading the power efficiency of the circuit.

An advantage which results from this is that the devices can be optimized to achieve the best performance in the run mode. In particular, the trip voltages of the output buffer stages can be made as nearly as possible equal to the trip voltage of the amplifier gain stage. This in turn means that the circuit can be operated down to lower levels of supply voltage $V_{DD}$, which is desirable.

According to the present invention there is provided: An integrated circuit oscillator, comprising: first and second resonator leads connectable to a resonator; first and second local power supply leads, at least one of the local power supply leads being connected through a resistance to a system power supply lead; an amplifier stage operatively connected to provide AC amplification between the first and second resonator leads, and operatively connected to be powered by the local first and second power supply leads; a first-stage output buffer, operatively connected to be powered by the local first and second power supply leads, including an output node, and a gain stage which an input connected to the amplifier stage and which is connected to drive the output node toward the voltage of one of the power supply leads selectively in accordance with the voltage received from the amplifier stage, wherein the gain stage is controlled by logic so that, in a first mode, the gain stage has a significantly lower conductance, at equal input voltages, than the amplifier stage, and, in a second mode, the gain stage has a significantly lower conductance, at equal input voltages, than the amplifier stage.

According to the present invention there is provided: An integrated circuit oscillator, comprising: first and second leads connectable to a resonator; an amplifier stage having an output side operatively connected to the first lead and an input side operatively connected to the second lead; an output buffer, having an input lead operatively connected to receive an AC signal from the input side of the amplifier stage, and connected to receive a quasi-DC signal from the output side of the amplifier stage; a bias feedback path, which provides a quasi-DC signal from the output side of the amplifier back to the input of the output buffer; first and second local power supply leads, at least one of the local power supply leads being connected through a resistance to a system power supply lead; wherein the output buffer comprises a first stage having an output node, a first active device, which has an input connected to the amplifier stage and which is connected to drive the output node toward the voltage of the first power supply lead selectively in accordance with the voltage received from the amplifier stage, a second active device, which has an input connected to the amplifier stage and which is connected to drive the output node toward the voltage of the second power supply lead selectively in accordance with the voltage received from the amplifier stage, a third active device, which is interposed between the first active device and the first local power supply lead, and which has an input controlled by logic so that, in a first mode, the input of the third active device is connected in parallel with the input of the first active device, and, in a second mode, the third device remains in a low-impedance condition, and which has a significantly higher impedance than the first active device, at input voltages where the first active device is just beginning to turn on.

According to the present invention there is provided: an integrated circuit oscillator, comprising: first and second leads connectable to a resonator; an amplifier stage having an output side operatively connected to the first lead and an input side operatively connected to the second lead; an output buffer, having an input lead operatively connected to the amplifier stage; a bias feedback path, which provides a quasi-DC signal from the output side of the amplifier back to the input of the output buffer; first and second local power supply leads, at least one of the local power supply leads being connected through a resistance to a system power supply lead; wherein the output buffer comprises a first stage having an NMOS driver transistor, a PMOS load transistor, and a PMOS pass transistor operatively connected in series between the first and second local power supply leads, the gates of the driver and load transistors being connected to the input lead of the buffer, wherein the pass transistor has a much lower conductance than the load transistor at equal small-signal gate voltages, and a second stage having an input connected to a node between the driver and load transistors of the first stage.

According to the present invention there is also provided: An integrated circuit oscillator, comprising: first and second leads connectable to a resonator; an amplifier stage having an output side operatively connected to the first lead and an input side operatively connected to the second lead; an output buffer, having an input lead operatively connected to receive an AC signal from the input side of the amplifier stage, and connected to receive a quasi-DC signal from the output side of the amplifier back to the input of the provides a quasi-DC signal from the output side of the amplifier back to the input of the output buffer; first and second local power supply leads, at least one of the local power supply leads being connected through a resistance to a system power supply lead; wherein the output buffer comprises a first stage having an NMOS driver transistor, a PMOS load transistor, and a PMOS pass transistor operatively connected in series between the first and second local power supply leads, the gates of the driver and load transistors being connected to the input lead of the buffer, wherein the pass transistor has a channel length which is much longer than that of the load transistor, and a second stage having an input connected to a node between the driver and load transistors of the first stage.

According to the present invention there is also provided: An integrated circuit oscillator, comprising: first and second leads connectable to a resonator; an amplifier stage, comprising a PMOS pull-up transistor and an NMOS pull-down transistor, and having an output side operatively connected to the first lead and an input side operatively connected to the second lead; an output buffer, having an input lead operatively connected to receive an AC signal from the input side of the amplifier stage, and connected to receive a quasi-DC signal from the output side of the amplifier stage; a bias feedback path, which provides a quasi-DC signal from the output side of the amplifier back to the input of the output buffer; first and second local power supply leads, at least one of the local power supply leads being connected through a resistance to a system power supply lead; wherein the output buffer comprises a first stage having an NMOS driver transistor, a PMOS load transistor, and a PMOS pass transistor operatively connected in series between the first and second local power supply leads, the gates of the driver and load transistors being connected to the input lead of the buffer, wherein the pass transistor has a channel length which is much longer than that of the pull-up transistor of the amplifier, and a second stage having an input connected to a node being the driver and load transistors of the first stage.

According to the present invention there is also provided: An integrated circuit oscillator, comprising: first and second leads connectable to a resonator; first and second local power supply leads, at least one of the local power supply leads being connected through a resistance to a system power supply lead; an amplifier stage, comprising an NMOS pull-down transistor and a PMOS pull-up transistor connected in series between the first and second local power supply leads; an output buffer, having an input lead operatively connected to the amplifier stage, wherein a first stage of the output buffer comprises an NMOS driver transistor and a PMOS load transistor operatively connected in series between the first and second local power supply leads; and a bias feedback path, which provides a quasi-DC signal from the output side of the amplifier back to the input of the output buffer; and wherein the quantity LP1/LN1 is at least 20% greater than the quantity LP2/LN2, where LN2 is the channel length of the pull-down transistor of the amplifier, LP2 is the channel length of the pull-up transistor of the amplifier, LN1 is the channel length of the driver transistor of the first stage of the buffer, and LP1 is the channel length of the load transistor of the first stage of the buffer.

BRIEF DESCRIPTION OF THE DRAWINGS

The present invention will be described with reference to the accompanying drawings, which are hereby incorporated by reference, wherein.

DESCRIPTION OF THE PREFERRED EMBODIMENTS

The present invention will now be described in great detail with reference to a sample preferred embodiment. However, it must be realized this embodiment is illustrative only. As will be recognized by those skilled in the art, a wide variety of modifications and variations can be made to still take advantage of the inventive concepts.

Figure 1:
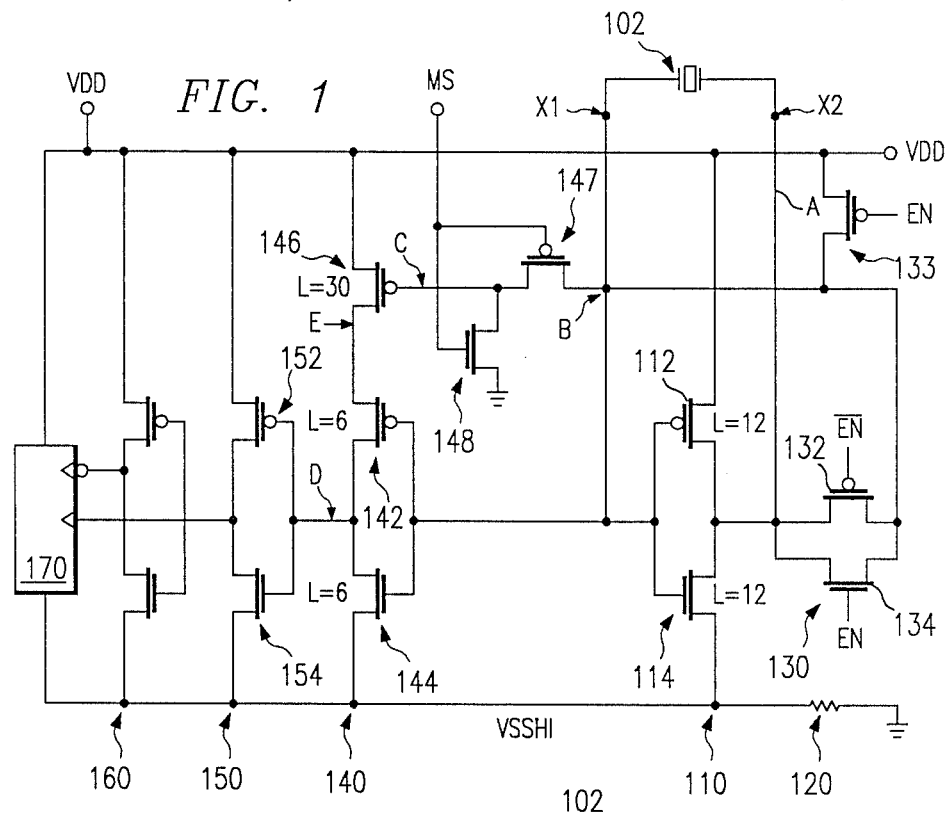
FIG. 1 shows a first embodiment of the invention.

FIG. 1 shows a sample embodiment of the invention. A crystal 102 is shown at the top of the Figure (but of course this crystal would normally be separated from the integrated circuit containing the active elements shown).

In the presently preferred embodiment, this crystal is a quartz crystal with a resonant frequency of 32.768 kHz, which is specified to an accuracy of 20 parts per million. (Such a crystal will typically have a Q of about 75000.)

This crystal is connected across a CMOS amplifier stage 110. This amplifier stage contains a pull-up transistor 112 and a pull-down transistor 114. In the presently preferred embodiment, the pull-up transistor 112 has a channel length of 12 microns, and the pull-down transistor 114 has a channel length of 12 microns also.

The pull-up transistor 112 is a PMOS enhancement mode transistor, and the pull-down transistor 114 is an N-channel insulated-gate (NMOS) enhancement mode transistor. The gates of these two devices are commonly connected to a node B at one side of the crystal, and their outputs are connected to a node A, at the other side of the crystal. In device 112, a back-gate connection is made to the supply voltage $V_{DD}$ (which in this embodiment may vary from 2.5 to 5.5 Volts), and a back gate connection for transistor 114 is made to a virtual ground (local supply voltage) $V_{SSH1}$, which will be between 0.5 and 1.5 Volts (when $V_{DD}$ is 2.5 Volts) under typical operating conditions.

The source resistor 120, in the presently preferred embodiment, has a value in the range of 8 to 10 Megohms, but of course other values could be used. (Alternatively, an active element could be substituted for all or part of this resistor, but this is less preferred.) The source resistor minimizes power consumption, by providing a virtual ground level for the oscillator (and for the first stages of the output buffer) which is far above the system ground voltage. When the oscillator is operating, the virtual ground level will be defined by the device threshold voltages (and will be equal to approximately one PMOS threshold voltage ($V_{TP}$) plus one NMOS threshold voltage ($V_{TN}$) below the on-chip positive supply voltage ($V_{DD}$)); but the source resistor will regulate the current consumed by the active circuits.

The output of the amplifier 110 is also connected to a transmission gate 130. This transmission gate includes an NMOS transistor 134 and a PMOS transistor 132, both with very long channels, connected in parallel. During steady-state operation, the gates of these two transistors are connected to substantially DC voltages (at nodes EN and EN*). (These lines are used differently to start oscillation at power-up, as will be described below.) This transmission gate preferably will have significant body effect, so that the effective threshold voltages of the devices in the transmission gate are increased slightly in magnitude. Therefore, even though the gates of the devices in the transmission gate are tied to $V_{DD}$ and $V_{SSH1}$, the transmission gate will be barely off if the bias at node B (as shown in FIG. 1) is optimal. However, if the bias point needs to be shifted, the transmission gate 130 will pass charge accordingly. The back bias connection of transistor 132 is to the supply voltage $V_{DD}$, and the back channel connection of transistor 134 is to supply voltage $V_{SSH1}$. In the present preferred embodiment, these transistors are each 2600 microns long.

The pull-up transistor 133 guarantees a low power state when the oscillator is turned off. In this state (where signal EN is low, and transmission gate 130 is therefore turned off), transistor 133 will pull node B high. This assures that p-channel transistors 112 and 142 will be turned off, and that n-channel transistor 114 and 144 will be turned on. Therefore, no current will flow through resistor 120, and voltage $V_{SSH1}$ will be equal to ground potential (zero volts). This helps assure low power consumption during standby mode, and also helps to guarantee a predictable turn-on sequence when oscillation is initiated.

The output of this transmission gate 130 is connected across to the input side of the amplifier stage 110. AC coupling from node A to node B will occur primarily through the crystal 102. The coupling through transmission gate 130 is quasi-DC, and serves to set the bias point of node B. The AC signal coupled through the crystal from node A to node B will be appropriately biased to drive the first stage 140 of the output buffer.

The first stage 140 of the output buffer is a somewhat unusual CMOS buffer stage. In addition to a driver transistor 144 and a load transistor 142, this stage also includes a pass transistor 146. In the presently preferred embodiment, the driver transistor and load transistor are both 6 microns long, but the pass transistor is 30 microns long.

Additional logic is included to control the pass transistor 146 in accordance with an external mode-select signal. A first mode-select transistor 147 (which is a PMOS transistor) connects the gate of the pass transistor to node B, if the mode-select signal goes low. The second mode-select transistor 148 (which is NMOS) connects the gate of the pass transistor to system ground (zero Volts, rather than the virtual ground) to turn this transistor hard on in a second mode.

During operation of the oscillator, if mode-select transistor 147 is turned on, pass transistor 146, load transistor 142, and pull-up transistor 112 will receive the same signal on their gates. However, since mode-select transistor 147 has a much longer channel than pull-up transistor 112 or load transistor 142, it will have a higher effective impedance when these transistors are just turned on (i.e. if node B is just below $V_{DD}-V_{TP}$). Thus, in this mode, much more current will be passed by amplifier 110 than by first stage 140. This helps to maximize loop gain.

In addition, the use of transistor 146 also permits the transistors of the first stage 140 to be made somewhat shorter than they otherwise would. Since transistor 147 provides a higher impedance when needed, transistor 142 and 144 can be made shorter, and transistor 112 and 114 can be much longer than would otherwise be desirable.

Figure 3:
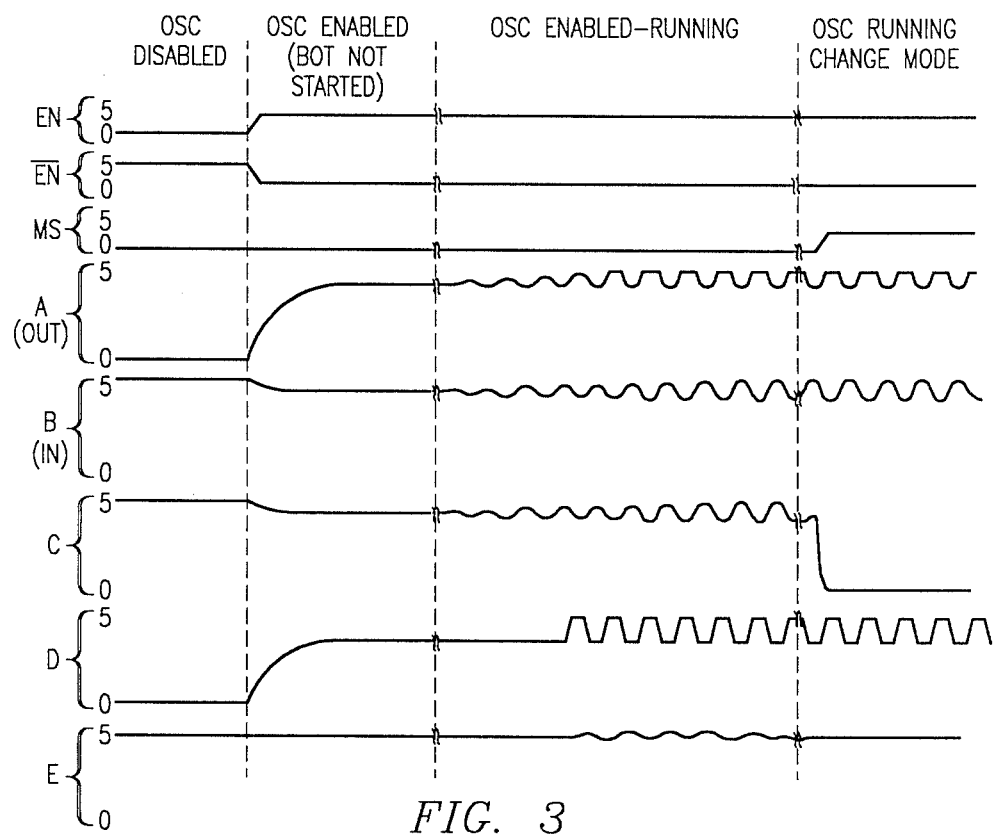
FIG. 3 shows timing diagrams of waveforms appearing at various points in the circuit of FIG. 1.

FIG. 3 shows samples of approximate waveforms appearing at various nodes shown in the circuit of FIG. 1, during the various modes of operation.

The first period shown, labelled "OSC DISABLED", represents periods when the oscillator is not being operated. At this time the enable signal EN is low (and its complement EN* is high), so that transmission gate 130 is turned off. PMOS transistor 133 is turned on (by the low level of signal EN), so that node B is pulled up to the positive supply voltage (5 V, in this example). PMOS transistors 142 and 112 are therefore turned hard off, so that no current will be drawn and no oscillation can occur. NMOS transistor 114 and 144 will be turned on, so that nodes A and D will be pulled down to virtual ground voltage $V_{SSH1}$. Since essentially no current is being drawn, no voltage drop will be present across resistor 120, and virtual ground voltage $V_{SSH1}$ will be at ground voltage (0 V).

The second period shown in FIG. 3, which is labelled "OSC ENABLED," represents the approximate timing relations after signal EN is driven high to start the oscillation. Transistor 133 turns off, and transmission gate 130 turns on, so that nodes A and B can move towards equal long-time-average voltages (which will be roughly equal to $V_{DD}-V_{TP}$). (As noted, transmission gate 130 is very long, so that nodes A and B are coupled with an effective time constant which is relatively long. As this occurs, current will be drawn through source resistor 120, so that voltage $V_{SSH1}$ also increases. These changes bring the oscillator to a condition where feedback can occur across amplifier 110. After some delay, oscillation therefore begins, at a frequency largely determined by the crystal 102. (The onset of oscillation is shown in the third period, labelled "OSC ENABLED—RUNNING.") As the amplitude of these oscillations increases, the AC signal on node B will eventually become large enough to begin switching devices 142 and 144. Since transistor 147 is turned hard on, the voltage on node C will be essentially equal to that on node B. Therefore, as the AC signal on node B increases, it will eventually become large enough to begin switching transistor 146 in phase with transistor 142 (which is controlled directly by node B). When all three of the transistors 142, 144, and 146 are being switched by the AC signal, an amplified signal will appear on node D (whose DC level has increased as virtual ground voltage $V_{SSH1}$ has increased).

Thus, the events during the second and third periods have established stable oscillation, at the desired frequency. Thereafter, during the fourth period (labelled "OSC RUNNING—CHANGE MODE), the mode-select signal MS is brought high, to change the mode of operation. This turns off PMOS transistor 147, and turns on NMOS transistor 148, so that node C (at the gate of PMOS pass transistor 146) is tied to ground. This keeps transistor 146 turned hard on, so that first-stage inverter 140 acts as if transistor 146 were shorted out, and a digital signal of the desired frequency continues to appear on node D.

In the presently preferred embodiment, the mode select signal MS is taken from a power fail monitoring signal. The system supply voltage is tracked and, when it falls below acceptable limits, the mode select signal is brought low. However, alternatively, of course, other sources could be used for this control signal.

The output of the first stage of the output buffer 140 (at node D) is connected to a second stage 150 of the output buffer. This second stage 150 is a more conventional CMOS inverter stage, except that the load transistor 152 and the driver transistor 154 are connected from the supply voltage only to the virtual ground $V_{SSH1}$, and not to the system ground. Similarly, in the presently preferred embodiment, a third stage 160 is connected to the output of the second stage 150. Thus, the output of the second 150 and third stage 160 provide complementary outputs from the oscillator, and thus provide complementary timing signals.

Some of the widths and lengths of important devices are as follows. These widths and lengths are specified in the presently preferred embodiment, and some of course, could be widely modified and varied. However, they will help to further illustrate, to those skilled in the art, the relation of the devices in the presently preferred embodiment.

The PMOS pass transistor 146 (in the first buffer stage 140) has a width of 30 microns and a length of 30 microns.

The PMOS mode-select transistor 146 has a width of 6.5 microns and a length of 2 microns.

The NMOS mode-select transistor 147 has a width of 6.5 microns and a length of 2 microns.

The PMOS load transistor 142 in the first buffer stage 140 has a width of 30 microns and a length of 6 microns.

The NMOS driver transistor 144 in the first buffer stage 140 has a width of 10 microns and a length of 6 microns.

The PMOS load transistor 152 in the second stage of the buffer has a width of 19.5 microns and a length of 2 microns.

The NMOS driver transistor 154 in the second stage of the buffer has a width of 6.5 microns and a length of 2 microns.

The PMOS pull-up transistor 112 in the amplifier 110 has a width of 60 microns and a length of 12 microns.

The NMOS pull-down transistor 114 in the amplifier 110 has a width of 20 microns and a length of 12 microns.

The PMOS transistor 132 in the transmission gate 130 has a width of 2.75 microns and a length of 2600 microns.

The NMOS transistor 134 in the transmission gate 130 has a width of 2.75 microns and a length of 2600 microns.

As is conventional in the art of timing circuits, flip-flops and counters are used to divide down the oscillator output to provide timing signals at desired intervals. In the presently preferred embodiment, the desired output frequency is 100 Hertz.

In the presently preferred embodiment, the output D has a frequency of $2^{15}$ per second (32.768 kHz). Three low-power flip-flop stages 170 (powered by $V_{DD}$ and $V_{SSH1}$) divide this down to 4096 Hertz.

To get the desired 100 Hertz output signal, a level-shifter and counter is used. Since 4096 is not an integer multiple of 100, the counter counts up to 41 for 24 counting cycles, and then counts up to 40 for every 25th counting cycle. This produces an output which includes phase error on 24 of every 25 output pulses, but which does have an average frequency of precisely 100 Hertz.

Of course, other subsystem configurations could be used instead. Depending on the relation of available crystal frequency to desired output frequency, some configurations do not require the non-integral division operation just described.

Figure 2:
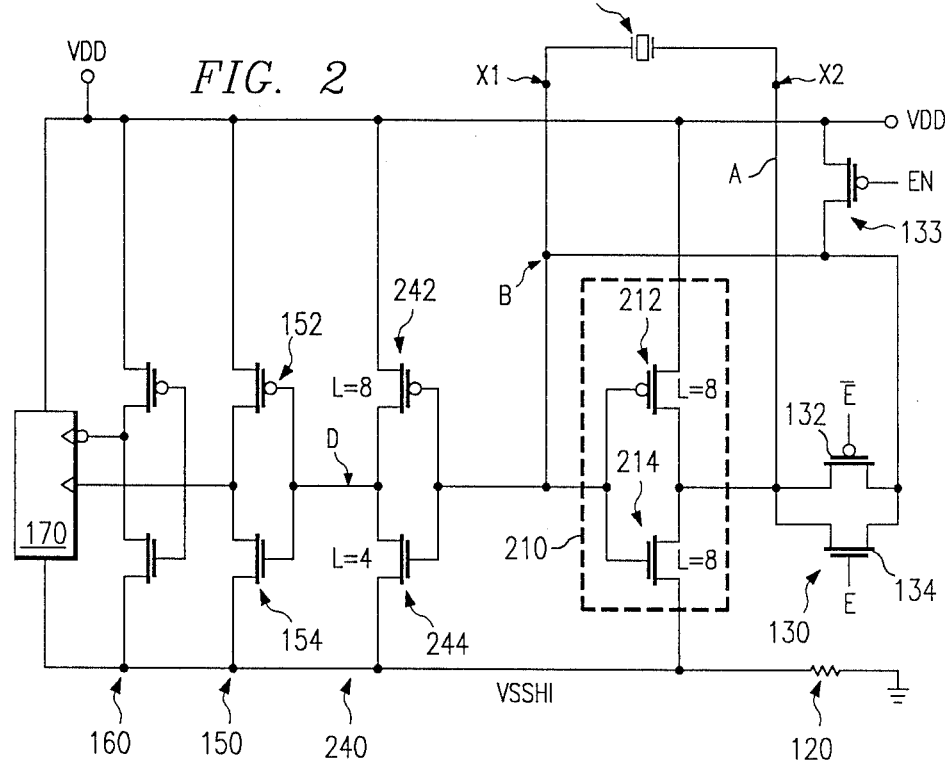
FIG. 2 shows an alternative, less preferred embodiment of a low power frequency-stabilized CMOS oscillator.

FIG. 2 shows an alternative, less preferred circuit configuration. Note that the first buffer stage 240 is asymmetrical, and the pass transistor 146 is omitted. In this embodiment, the NMOS driver transistor 244 is only 4 microns long, but the PMOS load transistor 242 is 8 microns long. The amplifier 210 uses 8 micron long transistors for pull-up 212 and pull-down 214.

In this embodiment, the load transistor 242 is made comparably long with pull-up 112, but driver 244 is made shorter than pull-down 114. This asymmetry helps to provide drive to the second stage, while adequately tracking the behavior of node A.

While the embodiment of FIG. 2 is believed to be novel, and may be advantageous in some applications, it has been found that the embodiment of FIG. 1 is more advantageous in the system context described.

Figure 5:
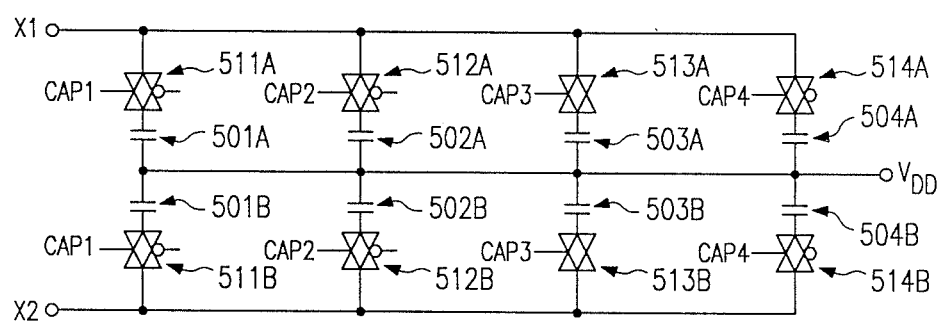
FIG. 5 shows the trimming capacitances used in the presently preferred embodiment.

FIG. 5 shows how capacitive trimming is preferably implemented, with trimming capacitor arrays available for connection to both input and output sides of the crystal. As shown in FIG. 5, the presently preferred embodiment uses a layout for trimming capacitors which provides selectable capacitors to be connected to both of the leads X1 and X2 of the crystal. The use of trimming capacitance to present an optimal load to a crystal resonator in a precision frequency-controlled oscillator circuit is well known to those skilled in the art, but in discrete configurations of such circuits it has not been practical to trim on both sides of the crystal. However, in integrated circuit embodiments, such as that of the present invention, this option can be used at little additional cost. The advantage of trimming on both sides of the crystal is that better loop gain can be maintained.

In the presently preferred embodiment, trimming is provided between the crystal connections X1 and the high supply voltage $V_{DD}$. However, alternatively, trimming capacitors to ground (or to a different reference voltage) could be used instead.

For each of the two crystal leads X1 and X2, four transmission gates 511A/B, 512A/B, 513A/B, and 514A/B are available to connect the line X1 or X2 to capacitors 501A/B, 502A/B, 503A/B, and/or 504A/B respectively. The transmission gates are pared, so that, for example, a high level on line CAP1 would turn on both transmission gate 511A (connecting line X1 to capacitor 501A) and transmission gate 511B (connecting line X2 to capacitor 501B). Similarly, line CAP2 controls both transmission gates 512A (connecting line X1 to capacitor 502A) and transmission gate 512B (connecting line X2 to capacitor 502B), and lines CAP3 and CAP4 are connected analogously. (Actually the signals CAP1 through CAP4 also have respective complementary signals CAP1* through CAP4*, which are connected to the inverting inputs of transmission gates 511A/B through 514A/B. However, for clarity, these additional lines are not shown.)

In the presently preferred embodiment, capacitors 501A through 504B are configured using gate oxides to silicon substrate. Using gate oxides of approximately 225 Angstroms thickness, the resulting specific capacitance is about 1.5 fF (femtoFarads) per square micron.

In the presently preferred embodiment, capacitors 501A and 501B have values of approximately 0.75 pF each, capacitors 502A and 502B have values of 1.37 pF each, capacitors 503A and 503B have values of approximately 2.3 pF each, and capacitors 504A and 504B have values of approximately 3.2 pF each. Two fixed load capacitors (of about 3.5 pF in this embodiment) are also connected to each of the crystal leads, in parallel with one of the trimming capacitor sets 501A-504A or 501B-504B. Of course, it will be readily understood by those skilled in the art that a tremendous variety of values could be used, and the foregoing numbers are provided simply for illustration.

After the integrated circuit is packaged, the static logic gates which switch these trimming capacitors in or out of the circuit will preferably be activated. Preferably, this is done by making a complete package, including a battery, an integrated circuit in a DIP (or other) package, and a crystal which is connected to the leads of the DIP package, and then checking the frequency of oscillation. (In test mode, two flip-flops are used to divide the frequency of oscillation by 4, and this 8 kHz signal is brought out to a pin.) Thus, the trimming capacitors can be used to jointly compensate any errors in the crystal resonant frequency and any deviations in the load capacitance seen by the crystal. A control signal sequence is then used to write appropriate bits into the static logic gates which select or deselect the trimming capacitors.

In the presently preferred embodiment, trimming capacitance is added to equal amounts on the input and output sides of the amplifier. However, alternatively, different trim capacitance values could be connected to the two sides, to provide a larger number of available increments of capacitance. In a further alternative (and less preferred) embodiment, trim capacitances could be added in increments to equalize the total capacitances (not merely the trim capacitances) on the two leads of the crystal. Depending on the circuit configuration and device dimensions chosen, the leads of the crystal may have capacitances which are initially unequal. (For example, one lead will normally be connected to the amplifier input, and will be loaded by the MOS gate capacitances of the amplifier and of the input to the following stage, and may therefore have a larger capacitance to ground.)

In the presently preferred embodiment, the trimming capacitance on each lead can be selected to be zero, or to have values ranging from about 0.75 pF to about 8 pF. Thus, the total added load capacitance (from the trimming capacitors plus the fixed load capacitor) on each of the crystal leads can be adjusted from about 3.5 pF to about 11 pF. This is in addition to the parasitic capacitances due to transistor gates, metallization, bonding leads, Miller capacitance, etc. The elements of the integrated circuit will typically provide about 6 pF of parasitic capacitance to each lead, in addition to the parasitic capacitance across the crystal (of about 1.5 pF). However, of course, a wide range of other values could be used.

Figure 4:
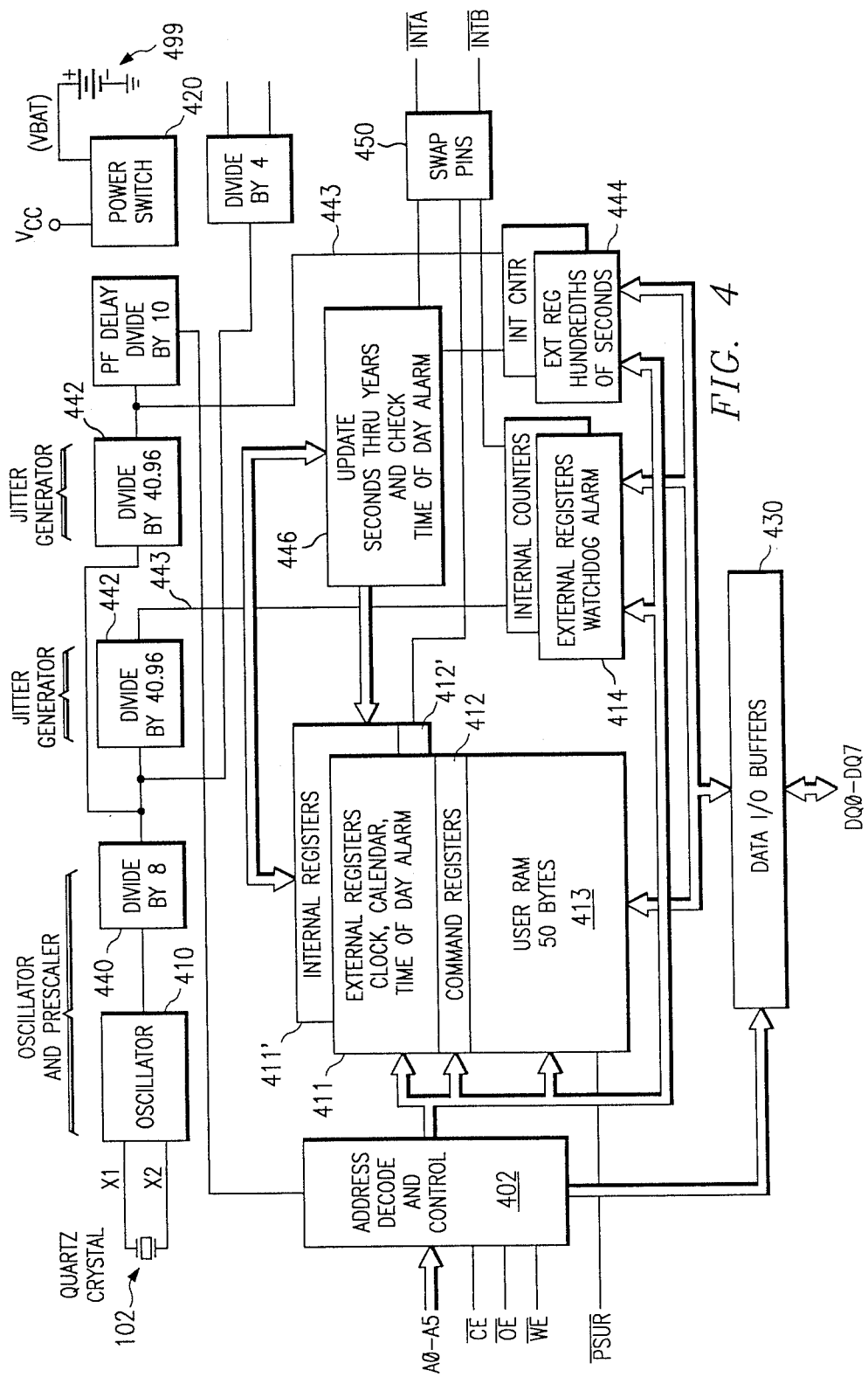
FIG. 4 shows the overall organization of a sample system embodiment employing the oscillator of FIG. 1.
Figure 6:
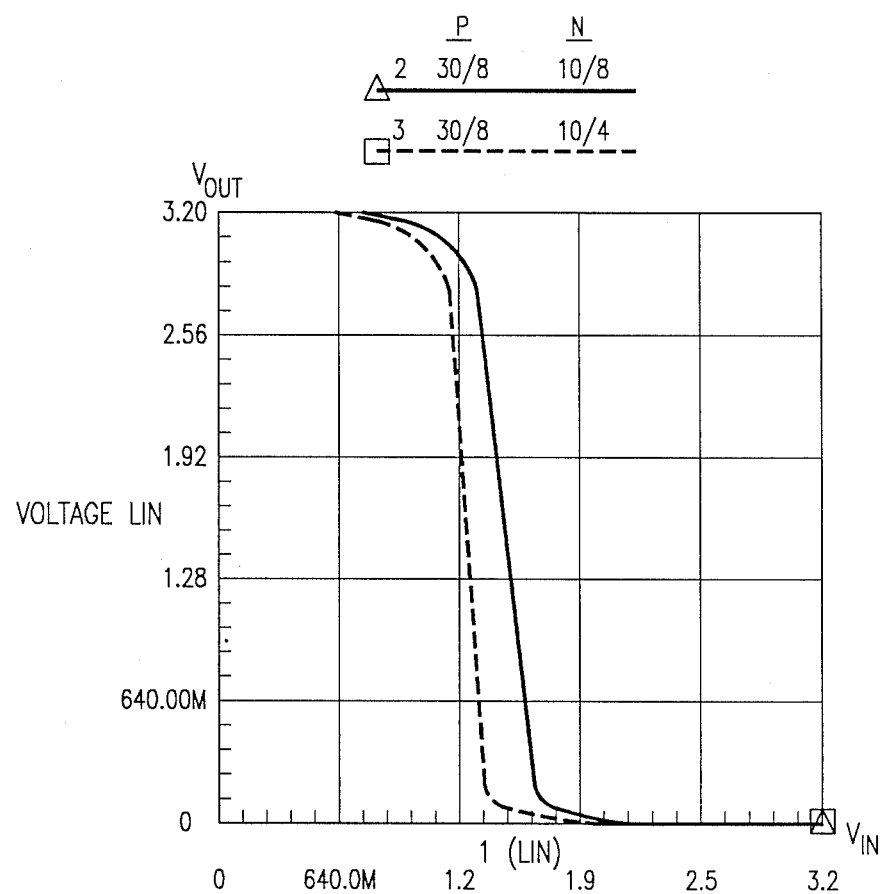
FIG. 6 shows a typical curve of output voltage ($V_{out}$) versus input voltage ($V_{in}$) behavior of an inverter stage for a typical MOS inverter circuit.

FIG. 4 shows a sample system embodiment employing the oscillator shown in FIG. 1. This sample subsystem embodiment uses the timing capabilities of this precision oscillator to provide a battery-backed clock circuit, which retains a very accurate time signal even when system power goes down. In addition, in a larger subsystem environment, the timing function is also used to monitor the activity of a microprocessor. For example, if a processor has not shown any activity on the pins being monitored over a certain length of time (for example one second or 100 seconds), this subsystem may be programmed to activate a signal which would indicate to the system that the microprocessor may have crashed. (This capability is referred to as the WatchDog (TM) mode of operation.)

Since the subsystem environment of the preferred embodiment is intended to be proof against a system power failure, a wide range of voltages must be tolerated on the on-chip power supply ($V_{DD}$). Normally, the system power supply voltage ($V_{CC}$) will be specified to a range between 4.5 and 5.5 Volts. The battery 499 provides a backup for the system power supply. However, to avoid excessive drain on the battery, the battery 499 will be connected to provide the on-chip power supply $V_{DD}$ only when the system voltage falls down as low as three Volts. Therefore, the local supply voltage $V_{DD}$ seen by the timing circuit may range from 5.5 Volts (when the system is operating, and at the high end of its voltage range) all the way down to 2.5 Volts (when the battery back-up has been activated, and is operating at the low end of its voltage range).

In FIG. 4, oscillator 410 includes the stages shown separately, in FIG. 1, as 110, 140, 130, 150, and 160. Divide-by-8 circuit 440 includes three flip-flops 170 (one of which is shown in FIG. 1, and each of the two divide-by-40.96 circuits 442 is implemented using a counter, as discussed above. One of the resulting 100 Hz outputs 443 is provided, through the watchdog alarm counter, as an output, and one is provided, through Hundredths register 444, to updating logic 446.

This integrated circuit provides a compact system, including a self contained Real Time Clock, Alarm, Watchdog Timer, and Interval Timer, in a 28 pin JEDEC DIP package. The integrated circuit is preferably packaged together with an embedded lithium energy source 499 and a quartz crystal 102, which eliminates need for any external circuitry. Data contained within 64 eight bit registers 411-414 and 444 (shown in FIG. 4) can be read or written in the same manner as bytewide static RAM. Data is maintained by intelligent control circuitry which detects the status of system power supply $V_{CC}$ and write-protects memory when $V_{CC}$ is out of tolerance. The lithium energy source 499 can maintain data and real time for over ten years in the absence of $V_{CC}$. The clock information includes hundredths of seconds, seconds, minutes, hours, day, date, month, and year information. The date at the end of the month is automatically adjusted for months with less than 31 days, including correction for leap years. The real-time clock operates in either 24 hour or 12 hour format with AM/PM indicator. The timer provides alarm windows and interval timing between 0.01 seconds and 99.99 seconds. The real time alarm provides for preset times of up to one week.

The integrated circuit executes a read cycle, under control of address decode/control logic 402, whenever WE* (Write Enable complemented) is inactive (high) anbd CE* (Chip Enable complemented) and OE* (Output Enable complemented) are active (low). The unique address specified by the six address inputs (A0-A5) defines which of the 64 registers 411-413 is to be accessed. Valid data will be available to the eight data output drivers 430 within $t_{ACC}$ (Access Time, which in the presently preferred embodiment is specified at 150 nsec) after the last address input signal is stable, providing that CE* and OE* access times are also satisfied. If OE* and CE* access times are not satisfied, then data access must be measured from the latter occurring signal (CE* or OE*), and the limiting parameter is either $t_{CO}$ (150 nsec, in the presently preferred embodiment) after the CE* transition, or $t_{OE}$ (75 nsec, in the presently preferred embodiment) after the OE* transition, rather than address access.

the integrated circuit is in the write mode whenever the W* (Write Enable) and CE* (Chip Enable) signals are in the active (Low) state after the address inputs are stable. The latter occurring on a falling edge of CE* or WE* will determine the start of a write cycle. The write cycle is terminated by the earlier rising edge of CE* or WE*. All address inputs must be kept valid throughout the write cycle. WE* must return to the high state for a minimum recovery state ($t_{WR}$, which in the presently preferred embodiment is specified at 10 nsec) before another cycle can be initiated. Data must be valid on the data bus with sufficient Data Set Up Time ($t_{DS}$, which in the presently preferred embodiment is 60 nsec) with respect to the earlier rising edge of CE* or WE*. The OE* control signal should be kept inactive (High) during write cycles to avoid bus contention. However, if the output bus has been enabled (CE* and OE* active), then WE* will disable the outputs in $t_{ODW}$ (which in the presently preferred embodiment is 50 nsec) from its falling edge.

This integrated circuit provides full functional capability when $V_{CC}$ is greater than 4.5 Volts, and write protects the register contents at 4.25 Volts typical. Data is maintained in the absence of $V_{CC}$ without any additional support circuitry. The supply voltage is constantly monitored, and, if it begins to fall, all inputs to the registers become Don't Care. However, the two interrupts INTA* and INTB* (INTB) and the internal clock and timers continue to run regardless of the level of $V_{CC}$. As $V_{CC}$ falls below approximately 3.0 Volts, a power switching circuit 420 connects the internal lithium energy source 499, to maintain the clock and timer data and functionality. During power up, when $V_{CC}$ rises above approximately 3.0 Volts, the power switching circuit 420 connects external $V_{Cc}$ and disconnects the internal lithium energy source 499. Normal operation can resume after $V_{CC}$ exceeds 4.5 Volts for a period of 150 msec.

The integrated circuit also has 64 8-bit registers 411, 412, 413, 414, and 444, which contain all of the Timekeeping, Alarm, Watchdog, Control, and Data information. These registers are memory locations which contain external (user accessible) registers 411 and 412, 413, 414, and 444, as well as internal registers 411', 412', 414', and 444' which contain additional copies of the data. The external copies are independent of internal functions, except that they are updated periodically by the simultaneous transfer of the incremental internal copy. The Command Register bits are affected by both internal and external functions. This register will be discussed later. The 50 bytes of user RAM registers 413 can only be accessed from the external address and data bus.

The preferred organization of registers 411–414 and 444 will now be discussed in greater detail. Registers 0, 1, 2, 4, 6, 8, 9 and A (within registers 411 and 444) contain time of day and date information. (Specifically, register 444 contains the hundredths-of-second information, and in software this register is referred to as register 0. Time of Day information is stored in BCD (binary-coded decimal) format. Registers 3, 5, and 7 contain the Time of Day Alarm Information. Time of Day Alarm Information is stored in BCD. Register B provides the Command Register 412, and information in this register is binary. Registers C and D provide the Watchdog Alarm Registers 414, and information in these two registers is in BCD. Registers E through 3F provide user RAM 413, and can be used to contain data at the user's discretion.

Registers 0, 1, 2, 4, 6, 8, 9, and A contain Time of Day data in BCD. Ten bits within these eight registers are not used and will always read zero regardless of how they are written. Bits 6 and 7 in the Months Register (9) are binary bits. When set to logical zero, EOSC (Bit 7) enables the Real Time Clock oscillator. This bit is set to logical one when the integrated circuit is shipped, to prevent drain on lithium energy source 499 during storage and shipment. This bit will normally be turned on by the user during device initialization. However, the oscillator can be turned on and off as necessary by setting this bit to the appropriate level. Bit 6 of this same byte controls the Square Wave Output (pin 24). When set to logical zero, the Square Wave Output Pin will output a 1024 Hz Square Wave Signal. When set to logic one the Square Wave Output Pin is in a high impedance state. Bit 6 of the Hours Register is defined as the 12 or 24 Hour Select Bit. When set to logic one, the 12 Hour Format is selected. In the 12 Hour Format, Bit 5 is the AM/PM Bit with logical one being PM. In the 24 hour Mode, Bit 5 is the Second 10 Hour bit (20–23 hours). The Time of Day Registers are updated every 0.01 seconds from the Real Time Clock, except when the TE bit (Bit 7 of Register B) is set low or the clock oscillator is not running.

The preferred method of synchronizing data access to and from the real-time clock is to access the Command Register 412 by doing a write cycle to address location 0B and setting the TE bit (Transfer Enable bit) to logic zero. This will freeze the External Time of Day Registers at the present recorded time, allowing access to occur without danger of simultaneous update. When the watch registers have been read or written, a second write cycle is made to location 0B, setting the TE bit to a logic one. (This will put the time of Day Registers back to being updated every 0.01 second.) No time is lost in the Real Time Clock, because the internal copy of the Time of Day Registers buffers are continually incremented while the external memory registers are frozen. An alternate method of reading and writing the Time of Day Registers is to ignore synchronization. However, any single read may give erroneous data, since the Real Time Clock may be in the process of updating the external memory registers as data is being read. The internal copies of seconds through years are incremented, and Time of Day Alarm is checked, during any period when hundreds of seconds reads 99, and are transferred to the external register when hundredths of seconds roll from 99 to 00. A way of making sure data is valid is to do multiple reads and compare. Similarly, another way of making sure that the write cycle has caused proper update is to do read verifies and re-execute the write cycle if data is not correct. The probability of an incorrect result is kept to a minimum due to the redundant structure of the Watchdog Time-Keeper.

Registers 3, 5, and 7 contain the Time of Day Alarm Registers. Bits 3, 4, 5, and 6 of Register 7 will always read zero regardless of how they are written. Bit 7 of Registers 3, 5, and 7 are mask bits. When all of the mask bits are logical zero, a Time of Day Alarm will only occur when Registers 2, 4, and 6 match the values stored in Registers 3, 5, and 7. An alarm will be generated every day when Bit 7 of Register 7 is set to a logical one. Similarly, an alarm is generated every hour when Bit 7 of Register 5 is set to a logical 1. If Bit 7 of Register 3 is set to a logical 1, an alarm will occur every minute when Register 1 (seconds) rolls from 59 to 00.

Time of Day Alarm Registers are written and read in the same format as the Time of Day Registers. The Time of Day Alarm Flag and Interrupt is always cleared when Alarm Registers are read or written.

Registers C and D contain the time for the Watchdog Alarm. The two registers contain a time count from 00.01 to 99.99 seconds in BCD. The value written into the Watchdog Alarm Registers can be written or read in any order. Any access to Register C or D will cause the Watchdog Alarm to reinitialize and clears the Watchdog Flag Bit and the Watchdog Interrupt Output. When a new value is entered or the Watchdog Registers are read, the Watchdog timer will start counting down from the entered value to zero. When zero is reached, the Watchdog Interrupt Output will go to the inactive state. The Watchdog Timer Countdown is interrupted and reinitialized back to the entered value every time either of the registers are accessed. In this manner, controlled periodic accesses to the Watchdog Time can prevent the Watchdog Alarm from ever going to an active level. If access does not occur, countdown alarm will be repetitive. The Watchdog Alarm Registers always read the entered value. The actual count down register is internal and is not readable. Writing registers C and D to zero will disable the Watchdog Alarm Feature.

Address location 0B is the Command register 412 where mask bit, control bits, and flag bits reside.

Bit 0 is the Time of Day Alarm Flag (TDF). When this bit is set internally to a logical one, an alarm has occurred. The time of the alarm can be determined by reading the Time of Day Alarm Registers. However, if the transfer enable bit is set to logical zero the Time of Day registers may not reflect the exact time that the alarm occurred. This bit is read only, and writing this register has no effect on the bit. The bit is reset when any of the Time of Day Alarm Registers are read.

Bit 1 is the Watchdog Alarm Flag (WAF). When this bit is set internally to a logical one, a Watchdog Alarm has occurred. This bit is read only and writing this register has no effect on the bit. The bit is reset when any of the Watchdog Registers are accessed.

Bit 2 of the Command Register 412 contains the Time of Day Alarm Mask Bit (TDM). When this bit is written to a logical one, the Time of Day Alarm Interrupt Output is deactivated regardless of the value of the Time of Day Alarm Flag. When TDM is set to logical zero, the Time of Day Interrupt Output will go to the active state which is determined by bits 0, 4, 5, and 6 of the Command Register 412.

Bit 3 of the Command Register 412 contains the Watchdog Alarm Mask Bit (WAM). When this bit is written to a logical one, the Watchdog Interrupt Output is deactivated regardless of the value in the Watchdog Alarm Registers. When WAM is set to logic zero, the Watchdog Interrupt Output will go to the active state which is determined by bits 1, 4, 5, and 6 of the Command Register 412. These four bits define how Pin-Swap Logic 450 will operate the Interrupt Output Pins INTA* and INTB* (INTB).

Bit 4 of the Command Register 412 determines whether both interrupts will output a pulse or level when activated. If Bit 4 is set to logic one, the pulse mode is selected. In this case the INTA and INTB will be driven for a minimum of 3 msec when activated.

When Bit 5 is set to logic one, the B interrupt will source current. When Bit 5 is set to logical zero, the B interrupt will sink current.

Bit 6 of the Command Register 412 directs which type of interrupt will be present on interrupt pins INTA* or INTB* (INTB). When set to logical one, INTA* becomes the Time of Day Alarm Interrupt Pin and INTB* (INTB) becomes the Watchdog Interrupt Pin. When Bit 6 is set to logical zero, the interrupt functions are reversed such that the Time of Day Alarm will be output on INTB* (INTB) and the Watchdog Interrupt will be output on INTA*. Caution should be exercised when dynamically setting this bit as the interrupts will be reversed even if in an active state.

Bit 7 of the Command Register 412 is for Transfer Enable (TE).

The presently preferred embodiment of the invention uses CMOS logic. However, the teachings set forth herein could be applied to other integrated circuit technologies as well, although less advantageously. For example, enhancement/depletion MESFET or complementary bipolar (NPN/PNP) circuits could be configured which were formally equivalent to the disclosed CMOS circuits. However, these technologies do not appear to have the potential for extremely low power operations that CMOS logic does. Therefore, these technologies in their present state would simply be inapplicable to many of the problems addressed by the present invention. However, if a new integrated circuit technology appears which does have both an active driver and an active load, of separate device types, in a normal gate, and which also has extremely low static power dissipation to hold a gate at either logic state, then it is possible that the teachings of the present invention could be advantageously adapted for use in such technology.

As will be recognized by those skilled in the art, the present invention may be adapted to a wide range of system and subsystem embodiments.

One example of an alternative embodiment is another CMOS embodiment, where the current-limiting resistor is interposed between the oscillator and the upper supply voltage. In this case, the bias points will be defined by the n-channel threshold voltages $V_{TN}$ (above the lower supply voltage). In this case, instead of the P-channel pass transistor 146, and N-channel pass transistor would preferably be added to the first buffer stage, to avoid excessive current consumption.

The foregoing merely provide a few examples of the versatility of the disclosed innovative concepts. The embodiments specifically discussed are therefore to be understood as illustrative of the innovative concepts, and not limiting. The full scope of the innovative concepts claimed is defined only by the claims of the issued patent.

Further description of various implementation features of the presently preferred embodiment, together with additional background on timekeeping circuits generally, may be found in the following applications of common assignee, which are hereby incorporated by reference:

Ser. No. 208,889, Filed 6/17/88 (Low Power Timekeeping System;

Ser. No. 208,891, Filed 6/17/88 (Dynamic PLA Time Circuit;

Ser. No. 208,287, Filed 6/17/88 (Dynamic CMOS Buffer for Low Current Switching; and Ser. No. 208,288, Filed 6/17/88 (Delay Circuit Providing Separate Positive and Negative Going Edge Delays.

What is claimed is:

1. An integrated circuit oscillator, comprising:
   first and second resonator leads connectable to a resonator;
   first and second local power supply leads, at least one of said local power supply leads being connected through a resistance to a system power supply lead;
   an amplifier stage operatively connected to provide AC amplification between said first and second resonator leads, and operatively connected to be powered by said first and second local power supply leads;
   a first-stage output buffer, operatively connected to be powered by said first and second local power supply leads, including
      an output node,
      and a gain stage which has an input connected to said amplifier stage and which is connected to drive said output node toward the voltage of one of said power supply leads selectively in accordance with the voltage received from said amplifier stage,
      wherein said gain stage is controlled by logic so that, in a first mode, said gain stage has a significantly lower conductance, at equal input voltages, than said amplifier stage, and, in a second mode, said gain stage has a significantly higher conductance, at equal input voltages, than said amplifier stage.

2. An integrated circuit oscillator, comprising:
   first and second leads connectable to a resonator;
   an amplifier stage having an output side operatively connected to said first lead and an input side operatively connected to said second lead;
   an output buffer, having an input lead operatively connected to receive an AC signal from said input side of said amplifier stage, and connected to receive a quasi-DC signal from said output side of said amplifier stage;
   a bias feedback path, which provides a quasi-DC signal from said output side of said amplifier back to said input of said output buffer;
   first and second local power supply leads, at least one of said local power supply leads being connected through a resistance to a system power supply lead;
   wherein said output buffer comprises a first stage having
      an output node,
      a first active device, which has an input connected to said amplifier stage and which is connected to drive said output node toward the voltage of said first power supply lead selectively in accordance with the voltage received from said amplifier stage,
      a second active device, which has an input connected to said amplifier stage and which is connected to drive said output node toward the voltage of said second power supply lead selectively in accordance with the voltage received from said amplifier stage,
      a third active device,
         which is interposed between said first active device and said first local power supply lead, and
         which has an input controlled b logic so that, in a first mode, said input of said third active device is connected in parallel with said input of said first active device, and, in a second mode, said third device remains in a low-impedance condition, and
         which has a significantly higher impedance than said first active device, at input voltages where said first active device is just beginning to turn on.

3. An integrated circuit oscillator, comprising:
   first and second leads connectable to a resonator;
   an amplifier stage having an output side operatively connected to said first lead and an input side operatively connected to said second lead;
   an output buffer, having an input lead operatively connected to said amplifier stage;
   a bias feedback path, which provides a quasi-DC signal from said output side of said amplifier back to said input of said output buffer;
   first and second local power supply leads, at least one of said local power supply leads being connected through a resistance to a system power supply lead;
   wherein said output buffer comprises
      a first stage having an NMOS driver transistor, a PMOS load transistor, and a PMOS pass transistor operatively connected in series between said first and second local power supply leads, the gates of said driver and load transistor being connected to said input lead of said buffer, wherein said pass transistor has a much lower conductance than said load transistor at equal small-signal gate voltages,
      and a second stage having an input connected to a node between said driver and load transistors of said first stage.

4. An integrated circuit oscillator, comprising:
   first and second leads connectable to a resonator;
   an amplifier stage, comprising a PMOS pull-up transistor and an NMOS pull-down transistor, and having an output side operatively connected to said first lead and an input side operatively connected to said second lead;
   an output buffer, having an input lead operatively connected to receive an AC signal from said input side of said amplifier stage, and connected to receive a quasi-DC signal from said output side of said amplifier stage;
   a bias feedback path, which provides a quasi-DC signal from said output side of said amplifier back to said input of said output buffer;
   first and second local power supply leads, at least one of said local power supply leads being connected through a resistance to a system power supply lead;
   wherein said output buffer comprises
      a first stage having an NMOS driver transistor a PMOS load transistor, and a PMOS pass transistor operatively connected in series between said first and second local power supply leads, the gates of said driver and load transistors being connected to said input lead of said buffer, wherein said pass transistor has a channel length which is much longer than that of said pull-up transistor of said amplifier, and a second stage having an input connected to a node between said driver and load transistors of said first stage.

5. An integrated circuit oscillator, comprising:
first and second leads connectable to a resonator;
first and second local power supply leads, at least one of said local power supply leads being connected through a resistance to a system power supply lead;
an amplifier stage, comprising an NMOS pull-down transistor and a PMOS pull-up transistor connected in series between said first and second local power supply leads;
an output buffer, having an input lead operatively connected to said amplifier stage, wherein a first stage of said output buffer comprises an NMOS driver transistor and a PMOS load transistor operatively connected in series between said first and second local power supply leads; and
a bias feedback path, which provides a quasi-DC signal from said output side of said amplifier back to said input of said output buffer;
and wherein the quantity LP1/LN1 is at least 20% greater than the quantity LP2/LN2, where
LN2 is the channel length of said pull-down transistor of said amplifier,
LP2 is the channel length of said pull-up transistor of said amplifier,
LN1 is the channel length of said driver transistor of said first stage of said buffer, and
LP1 is the channel length of said load transistor of said first stage of said buffer.

6. The integrated circuit oscillator of claim 3, wherein said pass transistor has a drawn channel length which is more than twice that of said load transistor.

7. The integrated circuit oscillator of claim 3, wherein said pass transistor has an effective channel length which is more than 50% greater than that of said load transistor.

8. The integrated circuit oscillator of claim 3, wherein said pass transistor has an effective channel length which is much greater than that of said load transistor.

9. The integrated circuit oscillator of claim 8, wherein said pass transistor has a channel length which is more than twice that of said load transistor.

10. The integrated circuit oscillator of claim 1, wherein said resistance has more than one megohm of resistance.

11. The integrated circuit oscillator of claim 2, wherein said resistance has more than one megohm of resistance.

12. The integrated circuit oscillator of claim 3, wherein said resistance has more than one megohm of resistance.

13. The integrated circuit oscillator of claim 4, wherein said resistance has more than one megohm of resistance.

14. The integrated circuit oscillator of claim 1, wherein said resistance comprises a resistor.

15. The integrated circuit oscillator of claim 3, wherein said resistance comprises a resistor having a resistance value of the order of magnitude of approximately ten megohms.

16. The integrated circuit oscillator of claim 1, wherein said second local power supply lead is connected through said resistance to ground potential, and said first local power supply lead is connected directly to a positive system power supply voltage.

17. The integrated circuit oscillator of claim 3, wherein said second local power supply lead is connected through said resistance to ground potential, and said first local power supply lead is connected directly to a positive system power supply voltage.

18. The integrated circuit oscillator of claim 3, wherein said pass transistor has a greater width and length than said load transistor.

19. The integrated circuit oscillator of claim 3, further comprising logic, connected to the gate of said pass transistor, and connected to turn said pass transistor hard on in a first mode, and to connect said gate of said pass transistor to said input lead of said buffer in a second mode.

20. The integrated circuit oscillator of claim 3, further comprising an NMOS mode-select transistor and a PMOS mode-select transistor having respective gates connected to an external mode-select signal, and NMOS mode-select transistor being connected between the gate of said pass transistor and system ground, and said PMOS mode-select transistor being connected between said gate of said pass transistor and said input lead of said buffer.

21. The integrated circuit oscillator of claim 3, wherein said second stage comprises an NMOS driver transistor and a PMOS load transistor connected in series between said first and second local power supply leads, and wherein said driver transistor of said first stage has a channel length which is more than twice as long as the respective channel length of said driver transistor of said second stage, and wherein said load transistor of said first stage has a channel length which is more than twice as long as the respective channel length of said load transistor of said second stage.

22. The integrated circuit oscillator of claim 1, wherein said amplifier consists essentially of a single CMOS stage.

23. The integrated circuit oscillator of claim 2, wherein said amplifier consists essentially of a single CMOS stage.

24. The integrated circuit oscillator of claim 3, wherein said amplifier consists essentially of a single CMOS stage.

25. The integrated circuit oscillator of claim 4, wherein said amplifier consists essentially of a single CMOS stage.

26. The integrated circuit oscillator of claim 1, wherein said amplifier consists essentially of an NMOS pull-down transistor and a PMOS pull-up transistor connected in series between said first and second local power supply leads.

27. The integrated circuit oscillator of claim 3, wherein said amplifier consists essentially of an NMOS pull-down transistor and a PMOS pull-up transistor connected in series between said first and second local power supply leads.

28. The integrated circuit oscillator of claim 3, wherein said amplifier consists essentially of an NMOS pull-down transistor and a PMOS pull-up transistor connected in series between said first and second local power supply leads, and wherein said pull-down transistor has a channel length which is significantly longer than the respective channel length of said driver transistor of said first stage of said buffer, and wherein said pull-up transistor has a channel length which is significantly longer than the respective channel length of said load transistor of said first stage of said buffer.

29. The integrated circuit oscillator of claim 3, wherein said second stage comprises an NMOS driver transistor and a PMOS load transistor connected in series between said first and second local power supply leads, and wherein said amplifier consists essentially of an NMOS pull-down transistor and a PMOS pull-up transistor connected in series between said first and second local power supply leads, and wherein said pull-down transistor has a channel length which is more than four times as long as the respective channel length of said driver transistor of said second stage of said buffer, and wherein said pull-up transistor has a channel length which is more than four times as long as the respective channel length of said load transistor of said second stage of said buffer.

30. The oscillator of claim 1, further comprising a quartz crystal connected across said first and second leads.

31. The oscillator of claim 3, further comprising a quartz crystal connected across said first and second leads.

32. The oscillator of claim 2, wherein said bias feedback path comprises a transmission gate including NMOS and PMOS transistors.

33. The oscillator of claim 3, wherein said bias feedback path comprises a transmission gate including NMOS and PMOS transistors.

34. The integrated circuit oscillator of claim 3, wherein said bias feedback path comprises NMOS and PMOS transistors having long channel lengths.

35. The integrated circuit oscillator of claim 3, wherein said second stage comprises an NMOS driver transistor and a PMOS load transistor connected in series between said first and second local power supply leads, and wherein said amplifier consists essentially of an NMOS pull-down transistor and a PMOS pull-up transistor connected in series between said first and second local power supply leads, and wherein said pull-down transistor has a channel length which is more than four times as long as the respective channel length of said driver transistor of said second stage of said buffer, and wherein said pull-up transistor has a channel length which is more than four times as long as the respective channel length of said load transistor of said second stage of said buffer.

36. The integrated circuit oscillator of claim 2, having input connections for a first system power supply at a first voltage and a second system power supply at a second voltage which is more negative than said first voltage, and wherein said second local power supply lead is connected through said resistance to the second system power supply.

37. The integrated circuit oscillator of claim 2, having input connections for a first system power supply at a first voltage and a second system power supply at a second voltage which is more negative than said first voltage, and wherein said second local power supply lead is connected through said resistance to the second system power supply, and wherein said first and third active devices of said output buffer first stage are P-channel insulated-gate filed-effect transistors, and said second active device of said output buffer first stage is an N-channel insulated-gate filed-effect transistor.

38. The integrated circuit oscillator of claim 2, having input connections for a first system power supply at a first voltage and a second system power supply at a second voltage which is more positive than said first voltage, and wherein said second local power supply lead is connected through said resistance to the second system power supply, and wherein said first and third active devices of said output buffer first stage are N-channel insulated-gate filed-effect transistors, and said second active device of said output buffer first stage is a P-channel insulated-gate filed-effect transistor.

39. The integrated circuit oscillator of claim 2, having input connections for a first system power supply at a first voltage and a second system power supply at a second voltage which is more positive than said first voltage, and wherein said second local power supply lead is connected through said resistance to the second system power supply.

* * * * *